US011984162B2

(12) United States Patent
Lin et al.

(10) Patent No.: US 11,984,162 B2
(45) Date of Patent: *May 14, 2024

(54) HYBRID SELF-TRACKING REFERENCE CIRCUIT FOR RRAM CELLS

(71) Applicant: Taiwan Semiconductor Manufacturing Company, Ltd., Hsinchu (TW)

(72) Inventors: Zheng-Jun Lin, Taichung (TW); Chung-Cheng Chou, Hsinchu (TW); Yu-Der Chih, Hsinchu (TW); Pei-Ling Tseng, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/981,977

(22) Filed: Nov. 7, 2022

(65) Prior Publication Data

US 2023/0065104 A1  Mar. 2, 2023

Related U.S. Application Data

(63) Continuation of application No. 17/106,725, filed on Nov. 30, 2020, now Pat. No. 11,495,294.
(Continued)

(51) Int. Cl.
*G11C 11/00* (2006.01)
*G11C 13/00* (2006.01)

(52) U.S. Cl.
CPC ........ *G11C 13/0064* (2013.01); *G11C 13/003* (2013.01); *G11C 13/004* (2013.01)

(58) Field of Classification Search
CPC .. G11C 13/0064; G11C 13/003; G11C 13/004
(Continued)

(56) References Cited

U.S. PATENT DOCUMENTS

| 4,434,479 A | * | 2/1984 | Chen | G11C 16/28 |
| | | | | 365/205 |
| 4,453,235 A | * | 6/1984 | Chao | G11C 17/12 |
| | | | | 365/233.5 |

(Continued)

FOREIGN PATENT DOCUMENTS

| CN | 101859158 A | 10/2010 |
| CN | 108231099 A | 6/2018 |

(Continued)

OTHER PUBLICATIONS

Chung-Cheng Chou et al.; "A 22nm 96KX144 RRAM macro with a self-tracking reference and a low ripple charge pump to achieve a configurable read window and a wide operating voltage range," TSMC, Date of Publication: Jun. 16, 2020.
(Continued)

*Primary Examiner* — Vu A Le
(74) *Attorney, Agent, or Firm* — Merchant & Gould P.C.

(57) ABSTRACT

The disclosed invention presents a self-tracking reference circuit that compensates for IR drops and achieves the target resistance state at different temperatures after write operations. The disclosed self-tracking reference circuit includes a replica access path, a configurable resistor network, a replica selector mini-array and a step current generator that track PVT variations to provide a PVT tracking level for RRAM verify operation.

20 Claims, 6 Drawing Sheets

Related U.S. Application Data

(60) Provisional application No. 62/968,468, filed on Jan. 31, 2020.

(58) Field of Classification Search
    USPC .......................................................... 365/148
    See application file for complete search history.

(56) References Cited

U.S. PATENT DOCUMENTS

| | | | |
|---|---|---|---|
| 6,292,398 B1 | 9/2001 | Pasotti et al. | |
| 2004/0179414 A1 | 9/2004 | Hsu | |
| 2010/0110768 A1 | 5/2010 | Choi | |
| 2012/0250402 A1 | 10/2012 | Song et al. | |
| 2014/0233329 A1* | 8/2014 | Chen .................. | G11C 7/00 |
| | | | 365/189.011 |
| 2014/0286088 A1 | 9/2014 | Takahashi et al. | |
| 2017/0365336 A1 | 12/2017 | Lin et al. | |

FOREIGN PATENT DOCUMENTS

| | | | |
|---|---|---|---|
| CN | 109300498 A | 2/2019 |
| CN | 109509492 A | 3/2019 |
| CN | 109509497 A | 3/2019 |
| JP | 2019053811 A | 4/2019 |
| KR | 1020190130445 A | 11/2019 |
| TW | 201801090 A | 1/2018 |

OTHER PUBLICATIONS

Chinese Office Action for Application No. 202110123835.6 mailed Jan. 5, 2024.

* cited by examiner

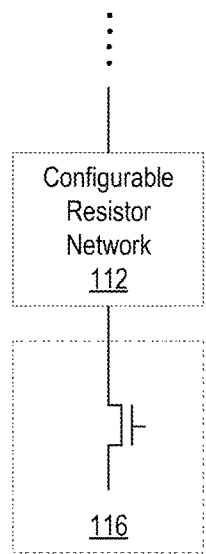
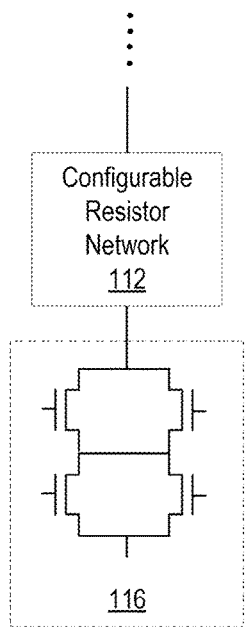
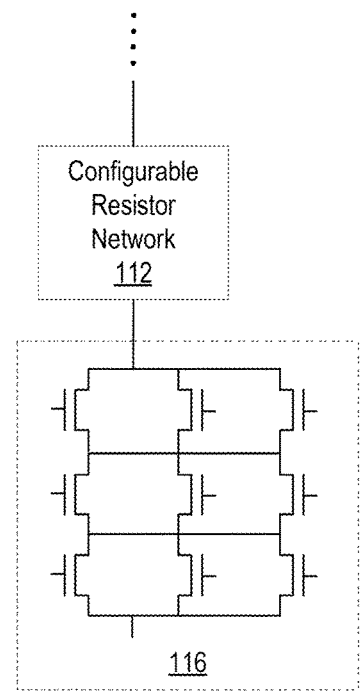
FIG. 4a    FIG. 4b    FIG. 4c

HYBRID SELF-TRACKING REFERENCE CIRCUIT FOR RRAM CELLS

CROSS-REFERENCE

This application is a continuation of U.S. application Ser. No. 17/106,725, filed Nov. 30, 2020, which claims the benefit of U.S. Provisional Application No. 62/968,468, filed on Jan. 31, 2020, which is incorporated by reference in its entirety.

BACKGROUND

Memory devices are used to store information in semiconductor devices and systems. Resistive Random-Access Memory (RRAM) cells are memory cells that store information based on changes in electric resistance. In general, an RRAM cell includes a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

BRIEF DESCRIPTION OF THE FIGURES

FIG. 4 illustrates a circuit diagram of three example configurations (FIGS. 4a, 4b and 4c) of the replica selector mini array 116;

DETAILED DESCRIPTION

Figure 1:
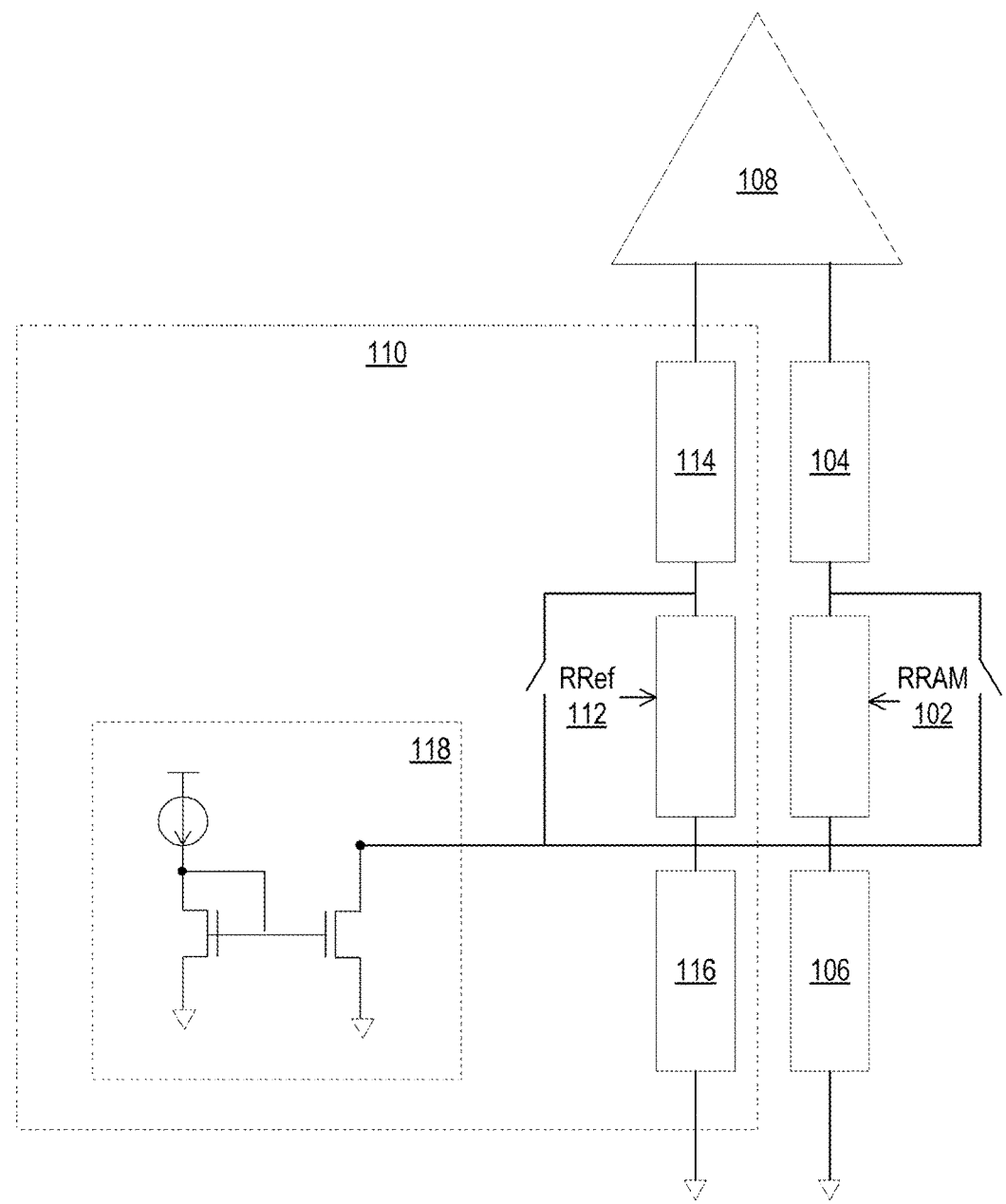
FIG. 1 illustrates a block diagram of an example self-tracking reference circuit for a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

RRAM is a promising non-volatile memory technology for embedded applications due to its low cost and compatibility to logic process. However, the reliability of a RRAM is related to its resistance state or filament size. The write/verify process is commonly used to achieve the target resistance states. A read sense amplifier can be used to do the verification process and can ensure that the read window is established.

Prior techniques use a constant current source for read/verify operations. However, verifying with a constant current source over a wide temperature range results in over/under writing RRAM element. Once the RRAM is over-set/reset, the endurance of the RRAM decreases and the RRAM cell can only be written with less counts. Once the RRAM is weak-set/reset, the RRAM's retention is decreased and the RRAM cell data may be lost easily. Thus, using a constant current level over a wide temperature range may impact the reliability of the RRAM.

Disclosed examples present a self-tracking reference circuit that compensates for IR drops and achieves the target resistance state at different temperatures after write operations. The disclosed self-tracking reference circuit includes a replica access path, a configurable resistor network, a replica selector mini-array and a step current generator to provide a PVT tracking level for verify and normal read operation.

FIG. 1 illustrates a block diagram of an example self-tracking reference circuit 100 for a memory device in accordance with some embodiments. In some examples, the self-tracking reference circuit is for a resistive memory cell 102, such as resistive random-access memory (RRAM) cell. Other examples are also possible. Resistive memory cells include a resistive element having a layer of high-k dielectric material arranged between conductive electrodes disposed within a back-end-of-the-line (BEOL) metallization stack. Resistive memory cells are configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. A resistive memory cell having a first (e.g., high) resistive state (HRS) or RESET corresponds to a first data value (e.g., a logical '0') and A resistive memory cell having a second (e.g., low) resistive state (LRS) or SET corresponds to a second data value (e.g., a logical '1').

In the disclosed example, one terminal of the RRAM cell 102 is connected to an access path 104 that connects the RRAM cell 102 to a sense amplifier circuit 108. The other terminal of the RRAM cell 102 is connected to a selector circuit 106. Typically, the access path 104 is configured using one or more transistor switches to enable greater control over the operation of the sense amplifier circuit 108.

In a RRAM memory device, a selector device is typically used to suppress the leakage current which may diminish sensing margins. In some examples, the selector circuit 106 is connected in series with the RRAM memory cell 102 and can be implemented using one or more transistors. In other examples, the selector circuit can be implemented using diodes. Other implementations are also possible.

In some examples, to read the current of the RRAM cell and decipher the data bit stored in the RRAM cell, a sense amplifier circuit 108 can be used. The sense amplifier circuit 108 can be a current-mode sense amplifier circuit that may be designed to have a low input impedance so that the RRAM current can, for the most part, be conducted into the sense amplifier circuit 108 itself. The sense amplifier circuit receives the current from the RRAM cell 102 and compares the current to a reference threshold current. Based on the comparison, the state of the RRAM cell 102 can be determined. Typically, a constant reference current is used as the threshold current against which the RRAM device current is compared at the sense amplifier circuit 108. Using a constant reference current during the verify process to establish the read window does not account for PVT variations. The disclosed example uses a self-tracking reference circuit that accounts for PVT variations and thus increasing the reliability of the RRAM.

In some examples, a self-tracking reference circuit 110 including a configurable resistor network 112, a replica access path 114, a replica selector mini array 116 and a step current generator 118 is used to provide a PVT-tracking level for verify and normal read operation. Each of the components of the self-tracking reference circuit 110 is described in further detail with respect to FIGS. 2-5.

Figure 2:
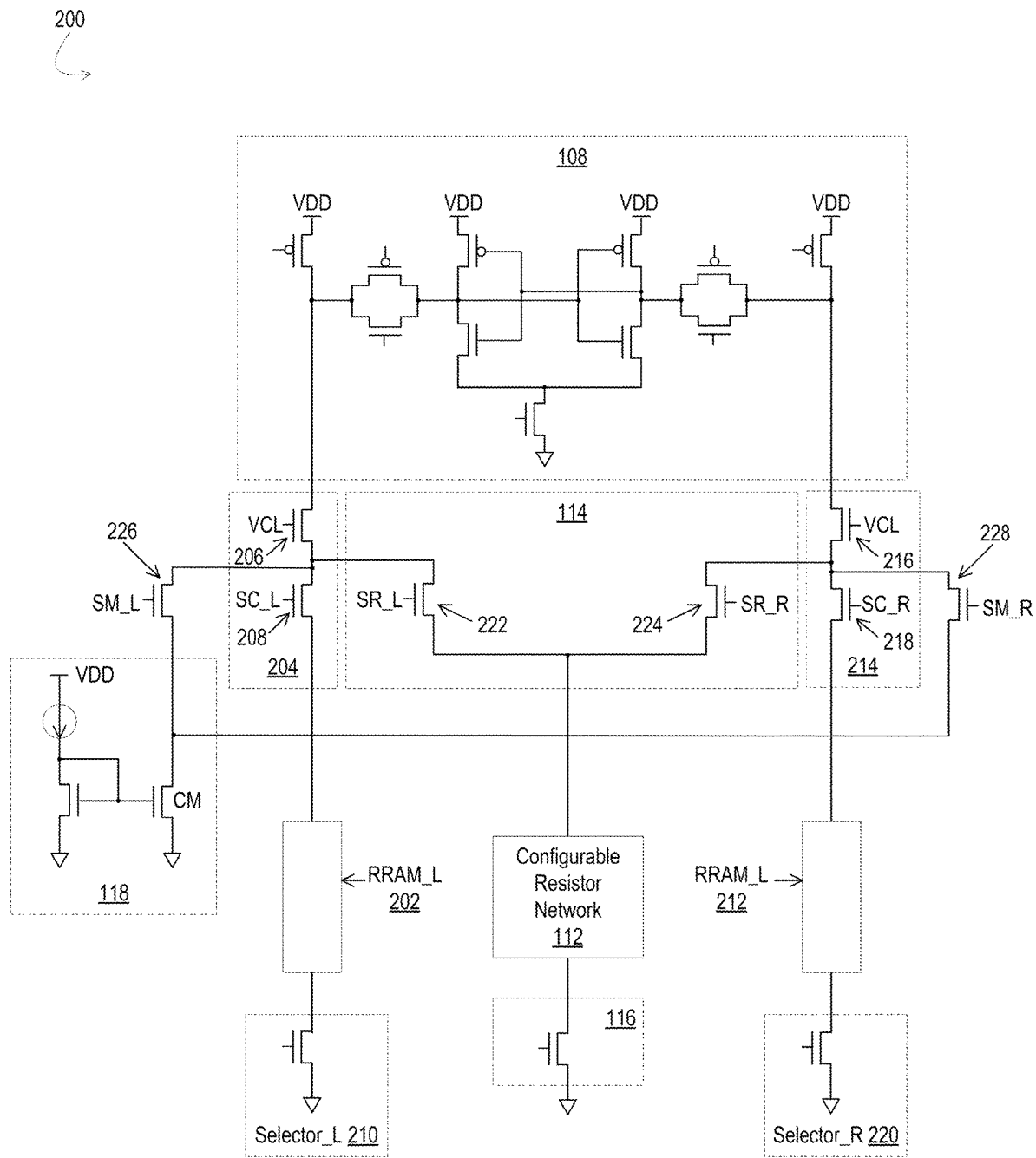
FIG. 2 illustrates a circuit diagram of an example self-tracking reference circuit for a memory device in accordance with some embodiments.

FIG. 2 illustrates a circuit diagram of an example self-tracking reference circuit 200 for a memory device in accordance with some embodiments. The example circuit 200 illustrates two RRAM devices sharing a self-tracking reference circuit. For example, in the disclosed example 200, the two RRAM devices include a left-side RRAM device and a right-side RRAM device that share a central self-tracking reference circuit. Other configurations are also possible.

In some examples, the left-side RRAM device includes an RRAM_L cell 202 that can be connected to an access path 204 and a selector_L device 210, the right-side RRAM device includes an RRAM_R cell 212 that can be connected to an access path 214 and a selector_R device 220, and a central self-tracking reference circuit that includes a configurable resistor network 112, a replica access path 114 and a replica selector mini array 116. In some examples, the self-tracking reference circuit architecture also includes a step-current generator circuit 118.

In some examples, the RRAM_L 202 and RRAM_R 212 are connected to a sense amplifier circuit 108 via the access paths 204 and 214 respectfully. The self-tracking reference circuit comprising the configurable resistor network 112 is also connected to the sense amplifier circuit 108 via the replica access path 114.

In some examples, the access path 204 that is utilized by the left-side RRAM device, which also includes the RRAM_L cell 202, and the selector_L circuit 210, includes two NMOS transistor switches 206 and 208. The two NMOS transistor, one clamping device 206 and one switch 208, are controlled by clamping voltage VCL and control signal SC_L. In some other examples, the access path 214 that is utilized by the right-side RRAM device, which also includes the RRAM_R cell 212 and the selector_R circuit 220, includes two NMOS transistor switches 216 and 218. The two NMOS, one clamping device 216 and one switch 218, are controlled by clamping voltage VCL and control signal SC_R.

In some examples, the replica access path 114 that is utilized by the self-tracking reference circuit, which includes the configurable resistor network 112 and the replica selector mini-array circuit 116 include the NMOS transistor switches 222 and 224 that are controlled by the control signals SR_L and SR_R respectively. The NMOS transistor switch 222 can be matched to be the same size as the NMOS transistor switch 208 and the NMOS transistor switch 224 is matched to be the same size as the NMOS transistor switch 218. The access paths 204, 214 and replica access path 114 ultimately connect the RRAM_L cell 202, the RRAM_R cell 212 and the configurable resistor network 112 to the sense amplifier circuit 108. Although the disclosed implementation uses NMOS switches, other devices may also be used in the configuration of the access paths 204 and 214.

In some examples, the sense amplifier circuit 108 can be implemented using a plurality of transistor devices in a configuration such as the one shown in FIG. 2. However, other sense amplifier circuit architectures can also be used.

In some examples, the sense amplifier circuit 108, at one time, operates to compare the current value of the RRAM_L 202 with the current value of the self-tracking reference circuit. Alternatively, the sense amplifier circuit 108 can operate to compare the current value of the RRAM_R 212 and the current value of the self-tracking reference circuit. The clamping devices, 206, 216 and transistor switches, 208, 218, 222, 224 can be controlled using the clamping voltage VCL and control signals SC_L, SC_R, SR_L and SR_R to select the RRAM device current that is input into the sense amplifier circuit 108 at any time.

For example, if the sense amplifier circuit 108 is configured to perform a read operation on the RRAM_L cell 202, the sense amplifier circuit 108 receives the left-side RRAM device path and the self-tracking reference circuit as the two inputs. The clamping devices 206 and 216 are turned on by VCL to define the read voltage level. Such a configuration can be achieved by turning on the transistor device 208 to enable the access path 204 to connect the RRAM_L cell 202 to the sense amplifier circuit 108. Additionally, the self-tracking reference circuit path can be configured to be the second input of the sense amplifier circuit 108 by turning on the transistor device, while turning off the transistor devices 222 and 218. Such a configuration creates a path where the configurable resistor network 112 is connected to the sense amplifier circuit 108 through the access path including transistor devices 224 and 216. The access path 214 connecting the RRAM_R cell 212 to the sense amplifier circuit 108 is disabled.

On the other hand, for example, if the sense amplifier circuit 108 is configured to perform a read operation on the RRAM_R cell 212, the sense amplifier circuit 108 receives the right-side RRAM device path and the self-tracking reference circuit as the two inputs. The clamping devices 206 and 216 are turned on by VCL to define the read voltage level. Such a configuration can be achieved by turning on the transistor device 218 to enable the access path 214 to connect the RRAM_R cell 212 to the sense amplifier circuit 108. Additionally, the self-tracking reference circuit path can be configured to be the second input of the sense amplifier circuit 108 by turning on the transistor device 222, while turning off the transistor devices 224 and 208. Such a configuration creates a path where the configurable resistor network 112 is connected to the sense amplifier circuit 108 through the access path including transistor devices 222 and

206. The access path 204 connecting the RRAM_L cell 202 to the sense amplifier 108 is disabled.

In some examples, the configurable resistor network 112 is configurable to emulate the resistive element of the RRAM_L cell 202 or RRAM_R cell 212. The configurable resistor network 112 can be configured to emulate the RRAM element of the resistive element of the RRAM_L cell 202 or RRAM_R cell 212 by adjusting one or more resistors in the configurable resistor network 112 such that the overall resistance value of the configurable resistor network 112 matches the resistance value of the RRAM cell at a particular state. The configurable resistor network 112 can be implemented using a series configuration or a parallel configuration. The configurable, configurable resistor network 112 is described in further detail in relation to FIG. 3.

The selector_L circuit 210 and selector_R circuit 220 are selector circuits that may be implemented using one or more transistors. The selector circuit mini-array 116 is configured to emulate the RRAM select transistor design and reflect temperature effects to track the track the cell resistance. The selector circuit mini-array 116 can be comprised of serial and parallel network of transistors to minimize device process variations. The replica selector mini-array 116 is described in further detail in relation to FIG. 4.

In some examples, a step current generator circuit 118 may be used to generate a small current difference for the RRAM cell 202, 212 write verify level to achieve step-by-step boundary trimming. For example, the step current generator circuit 118 may include a current generator circuit and a current mirror circuit that generates a current that may then be injected into the reference circuit path and can be controlled using switches. The switches may be implemented using NMOS transistor devices 226, 228. For example, NMOS transistor 226 can be used to enable the current injection from the step current generator circuit 118 and into the reference circuit path when the RRAM_R 212 is enabled and SC_L 208 is disabled. The control signal SM_L controls when the NMOS transistor device 226 is enabled/disabled. The NMOS transistor 228 can be used to enable the current injection from the step current generator circuit 118 and into the reference circuit path when the RRAM_L 202 is enabled and SC_R 218 is disabled. The control signal SM_R controls when the NMOS transistor device 228 is enabled/disabled. Other ways of implementing the switches is also possible. The operation of the step current generator circuit 118 is described in further detail in relation to FIG. 5.

Figures 3A, 3B:
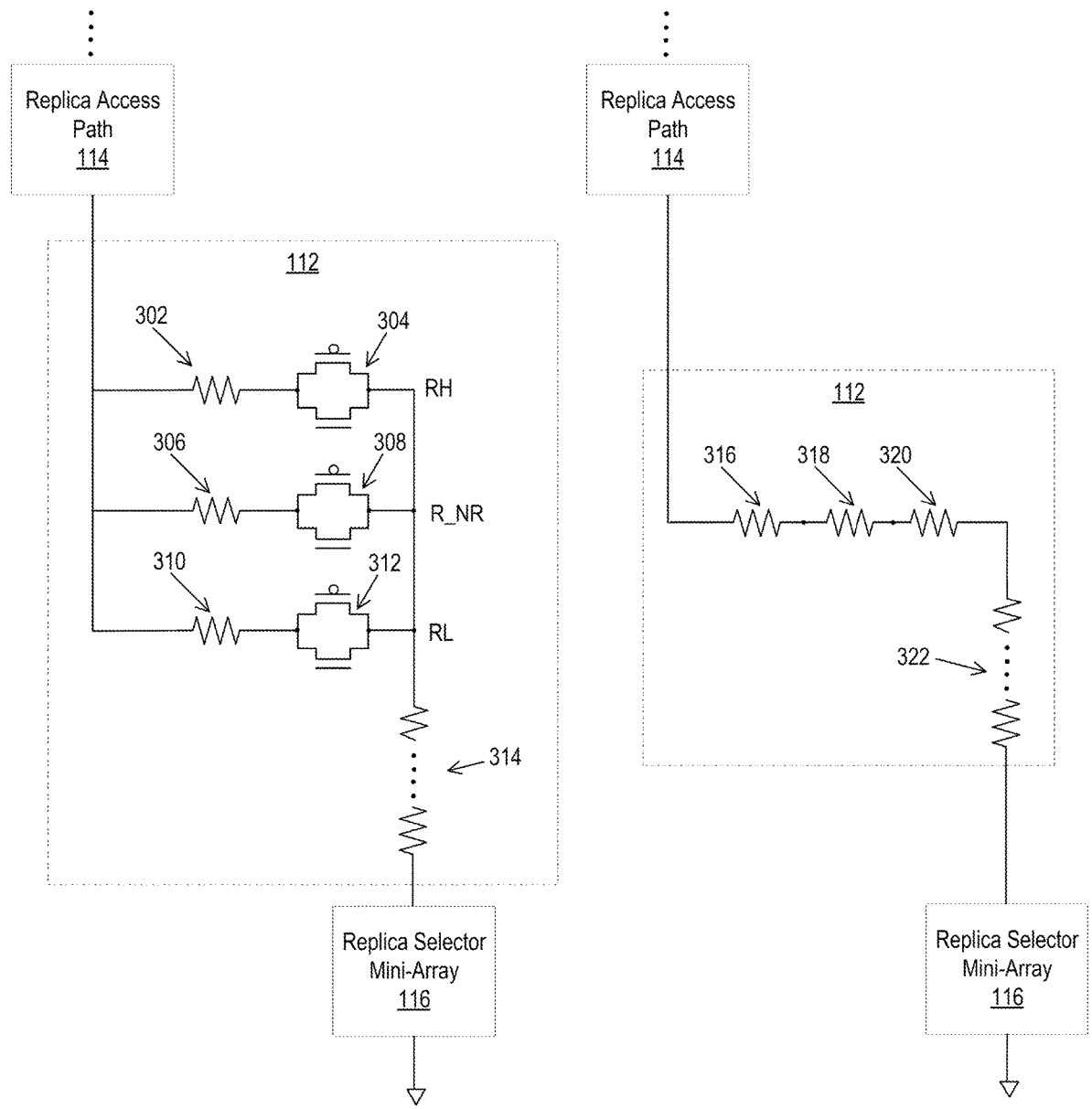
FIG. 3 illustrates a circuit diagram of two example configurations (FIGS. 3a, 3b) of the configurable resistor network 112.

FIG. 3 illustrates a circuit diagram 300 of two example configurations (FIGS. 3a, 3b) of the configurable resistor network 112. The configurable resistor network 112, which has less temperature dependency than the RRAM resistive element, emulates the RRAM element and provides the set verify level, the reset verify level and normal read levels. The configurable resistor network includes a plurality of resistors including a trimmable resistor that can be configured to provide the verify levels with minimal PVT variations.

FIG. 3a illustrates a parallel configuration for the configurable resistor network 112. In some examples, the parallel configuration of the configurable resistor network includes three resistors 302, 306, 310, connected in parallel, wherein each resistor can be configured to be connected or disconnected from the network using transmission gate switches 304, 308, 312. Each transmission gate switch includes a PMOS transistor device and a NMOS transistor device connected in parallel. For example, when the transmission gate switch 304 is enabled, resistor 302 can contribute to the configurable resistor network 112 resistance by supplying RH, the high resistance to generate the RESET verify level or the HRS level. When the transmission gate switch 312 is enabled, resistor 310 can contribute to the configurable resistor network 112 resistance by supplying RL, the low resistance to generate the SET verify level or LRS level. When the transmission gate switch 308 is enabled, resistor 306 can contribute to the configurable resistor network 112 resistance by supplying the middle resistance to generate normal read level.

In some examples, in addition to the resistance value supplied by the resistors 302, 306 or 310, a trimmable step resistor 314 also contributes to the overall resistance of the configurable resistor network 112. The trimmable step resistor can be configured to provide a small step resistance to provide a trimming value to the RH, R_NR or RL resistance values.

FIG. 3b illustrates a serial configuration for the configurable resistor network 112. The configurable resistor network 112 described in relation to FIG. 3a can also be implemented using a serial configuration. For example, resistors 316, 318 and 320 can be implemented in series with a shunt between each resistor that connects to the replica access path. Enabling all three resistors 316, 318 and 320 supplies a resistance value of RH, which is the high resistance to generate the RESET verify level. Enabling two of the three resistors 318, 320 and enabling the shunt to the replica access path (and thereby bypassing the resistor 316) supplies a resistance value of R_NR, which is the middle resistance to generate normal read level. Enabling one of the tree resistors 320 and enabling the shunt between resistors 316 and 318 and the shunt between resistors 318 and 320 to the access path (and thereby bypassing the resistors 316 and 318) supplies a resistance value of RL, which is the low resistance to generate the SET verify level. The resistors 316, 318, and 320 are further connected in series to a trimmable step resistor 322 that provides a trimming value similar to the trimmable step resistor 314 discussed in relation to FIG. 3a.

In some examples the configurable resistor network may be implemented using the parallel configuration described in FIG. 3a and in other examples, the configurable resistor network may be implemented using the serial configuration described in FIG. 3b. However, the serial configuration described in relation to FIG. 3b can reduce the area by as much as 36% or even higher depending on the technology and the size of the resistor values. Other configurations of the configurable resistor network 112 are also possible.

FIG. 4 illustrates a circuit diagram 400 of three example configurations (FIGS. 4a, 4b and 4c) of the replica selector mini array 116. The replica selector mini-array can be configured to track the selector circuits 210, 220 associated with RRAM cells 202, 212.

In some examples, the replica selector mini-array 116 can be configured to minimize the RRAM cell current variations across PVT. FIGS. 4a-4c illustrate various implementations for the replica mini-array circuit 116. For example, FIG. 4a illustrates an implementation of the replica selector mini-array circuit 116 that includes a single NMOS transistor device. In a single NMOS transistor configuration, the implemented NMOS transistor device matches the selector circuit 210 or 220. Other types of devices can also be used to implement the single device replica selector mini-array circuit 116 is also possible.

Although the replica selector mini-array 116 can be implemented using a single transistor design as illustrated in FIG. 4a, increasing the density of the replica selector mini-array 116 can decrease the reference current variations across PVT. A reference current that includes minimal variations over PVT can provide verify level to set/reset RRAM cells to the same resistance. However, increasing the density of the replica selector mini-array 116 comes with an increase in layout area. The tradeoff between small current variation and small layout area can be evaluated by the implementor to determine the ideal density of the replica selector mini-array circuit 116 for the underlying application.

For example, FIG. 4b illustrates an implementation of the replica selector mini-array circuit 116 that includes four NMOS transistor devices. The four-transistor configuration can be implemented with two sets of two NMOS transistors in a parallel configuration connected in a series configuration as illustrated in FIG. 4b. The four-transistor configuration provides a topology that can be represented as: (R//R)+(R//R), wherein the "R" relates to the resistance associated with each transistor in the four transistor configuration. The resistor value is related to the size of the transistor and can be adjusted by adjusting the resistor sizing. In the disclosed example, the transistors are sized to be the same such that the resistance values for each of the transistors within the four-transistor configuration is also the same.

For example, FIG. 4c illustrates an implementation of the replica selector mini-array circuit 116 that includes nine NMOS transistor devices. The nine-transistor configuration can be implemented using nine transistors connected in series and parallel configurations as illustrated in FIG. 4c. The nine-transistor configuration provides a topology that can be represented as: (R//R//R)+(R//R//R)+(R//R//R), Similar to the four-transistor configuration, the nine-transistor configuration also uses "R" to denote the resistance associated with each transistor in the nine transistor configuration.

In some examples, the nine-transistor replica selector mini-array circuit 116 provides a smaller 1-sigma current variation than the four-transistor replica selector mini-array circuit 116 and the four-transistor replica selector mini array circuit 116 provides a smaller 1-sigma current variation than the one-transistor replica selector mini array circuit 116. However, the number of transistors directly impact the layout area. For most applications, a four-transistor implementation, such as the one illustrated in FIG. 4b, may provide the best trade-off between smaller current variations and minimal layout area. For different application, different implementations may also provide the best tradeoff between current variation and layout area.

Figure 5:
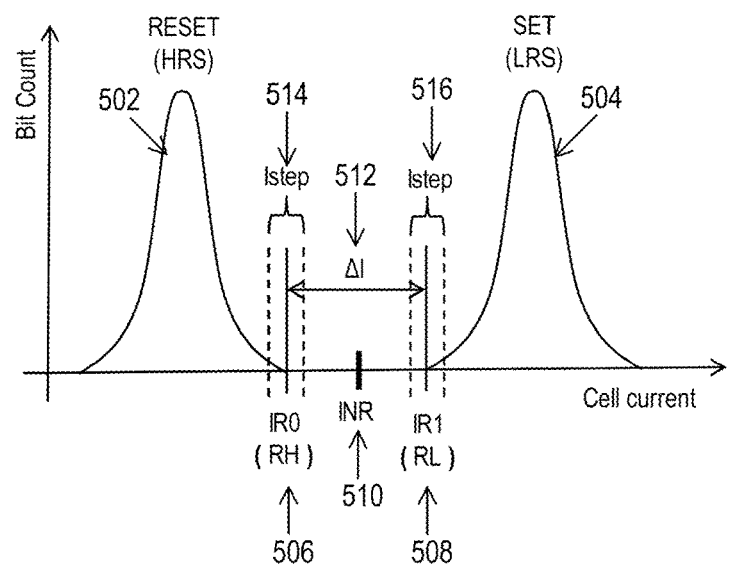
FIG. 5 illustrates a graphical plot 500 of an example relationship between RRAM cell current vs. bit count and the effect of a step current injection on the relationship

FIG. 5 illustrates a graphical plot 500 of an example relationship between RRAM cell current vs. bit count and the effect of a step current injection on the relationship. In some examples, the x-axis of the graphical plot 500 illustrates the RRAM cell current and the y-axis of the graphical plot illustrates the bit count. The curve 502 represents a RRAM cell current during the RESET state or HRS. The curve 504 represents a RRAM cell during the SET state or LRS during ideal operations. The IR0 or RH level 506 can be the maximum RRAM cell current that can still represent the RESET verify level and IR1 or RL level 508 can be the minimum RRAM cell current that can still represent the SET verify level. The INR level 510 is the middle resistance level that represents the normal read level. The AI 512 represents the read window and is the different between the RRAM cell current at RH, IR0 506, and the RRAM cell current at RL, IR1 508.

In some examples, during normal operations of the RRAM device, a RRAM cell can be switched between the HRS and LRS frequently. But each operation can introduce permanent damage, sometimes referred to as degradation. Endurance or electric fatigue is the number of SET/RESET cycles that can be endured before HRS and LRS are no longer distinguishable. When an RRAM cell is over SET/RESET, the boundary of the RESET and SET curves 502, 504 drift apart further and the LRS can no longer be RESET to HRS and the HRS can no longer be SET to LRS.

The step current generator 116 can generate a small temperature invariant current that can be injected to shift the boundary of the RESET curve 502 and SET curve 504 such that the IR0 at RH 506 and IR1 at RL 508 can be shifted within a range represented by broken lines 514 for the IR0 boundary current and shifted within a range represented by broken lines 516 for the IR0 boundary current. Thus, the step current generator 116, can generate a small current different for RRAM write verify level to achieve step-by-step boundary trimming. The injection of the current is controlled by the transistor switches 226 and 228 and control signals SM_L and SM_R as described in FIG. 2 In some examples, the step-by-step boundary trimming and tailing bit can be SET/RESET with propose write bias and thus avoid issues with over-SET/RESET.

Figure 6:
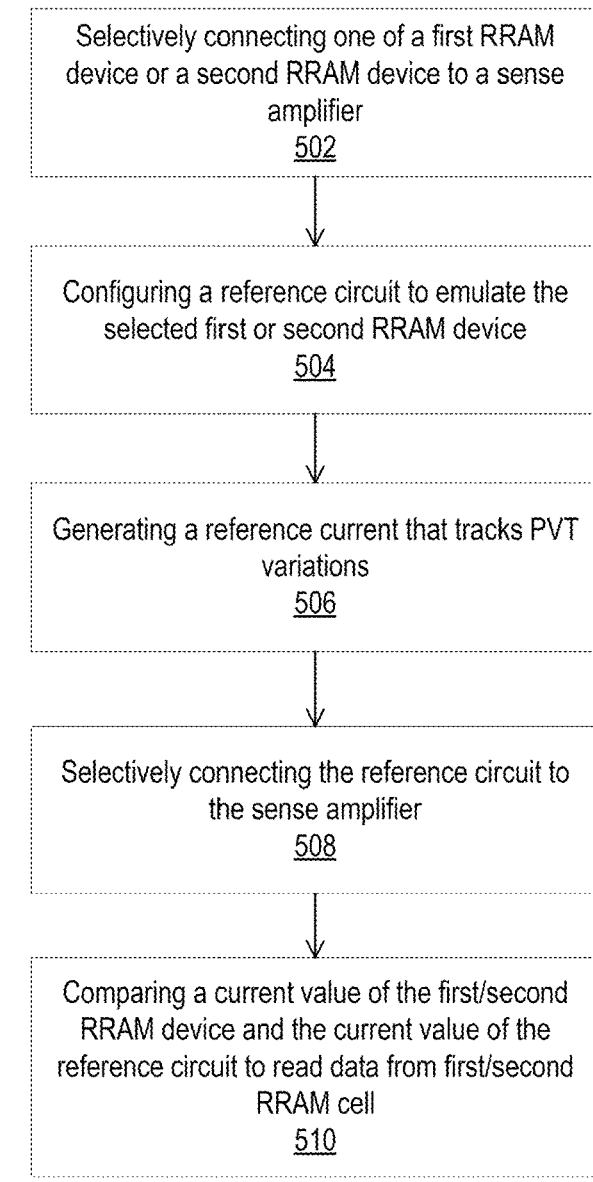
FIG. 6 illustrates an example method for using a self-tracking reference circuit in reading data from a RRAM cell.

FIG. 6 illustrates an example method for using a self-tracking reference circuit in reading data from a RRAM cell 600. The steps of the example method 600 can be performed using a self-tracking reference circuit such as the example circuit described in relation to FIG. 2.

At example step 502, the method 600 includes selectively connecting one of a first RRAM device or a second RRAM device to a sense amplifier circuit 108. For example, the first and second RRAM devices each include: a RRAM cell, an access path connecting the RRAM cell to the sense amplifier circuit 108; and a selector circuit, also connected to the RRAM cell. In some examples, the RRAM cell can include RRAM cells such as RRAM_L cell 202 and RRAM_R cell 204 described in relation to FIG. 2. One of the terminals of the RRAM cell is connected to an access path, which may be implemented by one or more transistor devices, such as NMOS transistor devices 206, 208 or 216, 218 as described in relation to FIG. 2. The selector circuit can be a selector circuit such as selector_L 210 or selector_R 220 as described in relation to FIG. 2. The selection between connecting the first RRAM device or the second RRAM device to the first input terminal of the sense amplifier circuit can be made using one or more switch devices, such as the implementation using NMOS transistor device switches 208, 222, 214, and 224 as described in relation to FIG. 2.

At example step 504, the method 600 includes configuring a reference circuit to emulate the selected first or second RRAM device. In some examples, the reference circuit includes a replica access path 114, a configurable resistor network 112 and a replica selector mini-array circuit 116.

For example, the reference circuit can be configured to emulate the selected first or second RRAM device by configuring the configurable resistor network 112 to emulate a resistive element of the RRAM cell of the selected RRAM device. In some examples, the configurable resistor network 112 provides the set verify level, reset verify level and normal read level. The configurable resistor network 112 can be composed of serial and parallel combinations of resistors to provide a wide range of verify levels. Emulating the resistive element of a RRAM cell includes configuring the resistor devices (302, 306, 310 in case of a parallel configuration and 316, 318, 320 in case of serial configuration) as well as the step resistor device 314 or 322 of the reference circuit to have a resistance that matches the resistance of the RRAM cell of the selected RRAM device. The configurable resistor network 112 is described in further detail in relation to FIGS. 2 and 3.

Additionally, in some examples, the reference can be configured to emulate the selected first or second RRAM device by configuring the replica access path 114 and replica selector circuit 116 to emulate the access path 104 and selector circuit 106 of the selected RRAM device.

In some examples, the replica access path 114 can be implemented to track one or more logic device resistances, metal wire resistances and leakage along the access path associated with the first or second RRAM device. Emulating the access path 104 includes matching the impedance value of the access path 104 using one or more transistor devices as described in relation to FIG. 2.

In other examples, the replica selector mini-array circuit 116 is configured to reflect temperature effects to track the cell resistance. The replica selector mini-array circuit 116 can be composed of serial and parallel network of transistors to minimize device process variations. Emulating the selector circuit 106 includes matching the impedance value of the selector circuit 106 using one or more transistor device as described in relation to FIGS. 2 and 4.

At example step 506, the method 600 includes generating a reference current that tracks process, voltage and temperature (PVT) variations. In some examples, during manufacturing, the physical layout of the reference circuit is typically placed near the RRAM device. Therefore, the reference circuit experiences and tracks the PVT variations that the RRAM device is subject to.

At example step 508, the method 600 includes selectively connecting the reference circuit a second input terminal of the sense amplifier circuit 108. In some examples, the reference circuit can be connected to the second input terminal of the sense amplifier circuit 108.

At example step 510, the method 600 includes comparing a current value of the first or second RRAM device (which ever is selected to be connected to the first input terminal of the sense amplifier circuit 108) and the current value of the reference circuit. Based on the comparison of the current values, the data value stored in the RRAM cell can be read. For example, a high resistance state may indicate a logic "0" value, and a low resistance state may indicate a logic "1" value. Other methods of reading the RRAM cell data is also possible.

The present disclosure thus includes embodiments of a current reference circuit for a resistive random-access memory (RRAM) cell. The current reference circuit includes a configurable resistor network, a replica access path, a replica selector circuit and a step current generator circuit. The configurable resistor network is configured to emulate a resistive element of the RRAM cell. The replica access path is connected to a first terminal of the configurable resistor network and is configured to emulate an access path associated with the RRAM cell. The replica selector circuit is connected to a second terminal of the configurable resistor network and is configured to emulate a selector circuit associated with the RRAM cell. The step current generator circuit is connected to the configurable resistor network and is used to adjust the reference current level provided by the current reference circuit. Further, the replica access path, the configurable resistor network, the replica selector circuit and the step current generator circuit are configured to track process, voltage and temperature (PVT) variations.

In accordance with further embodiments, a system to read RRAM data is disclosed. The system includes a resistive random-access memory (RRAM) device, wherein the RRAM device includes: a RRAM cell, a first terminal of an access path connected to a first terminal of the RRAM cell, and a selector circuit connected to a second terminal of the RRAM cell. The system further includes a current reference circuit, wherein the current reference circuit includes: a configurable resistor network, wherein the configurable resistor network is configured to emulate a resistive element of the RRAM cell, a replica access path, wherein a first terminal of the replica access path is connected to a first terminal of the configurable resistor network and wherein the replica access path emulates the access path associated with the RRAM cell and a replica selector circuit connected to a second terminal of the configurable resistor network and wherein the replica selector circuit emulates the selector circuit associated with the RRAM cell. The system also includes a sense amplifier circuit including two input terminals, wherein a second terminal of the access path is connected to one input terminal of the sense amplifier circuit and a second terminal of the replica access path is connected to another input terminal of the sense amplifier circuit.

In accordance with still further embodiments, a method to use a self-tracking reference circuit to read data from a RRAM device is disclosed. The method includes selectively connecting one of a first RRAM device or a second RRAM device to a first input of a sense amplifier, wherein the each of the first and second RRAM devices include a RRAM cell. The method also includes configuring a reference circuit to emulate the selected first or second RRAM device and generating a reference current by the reference circuit that tracks process, voltage and temperature (PVT) variations. The method further includes selectively connecting the reference circuit to a second input of the sense amplifier and comparing a current value of the selected first or second RRAM device with reference current by the sense amplifier to read data from the first or second RRAM cell.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A current reference circuit for a memory cell, comprising:
   a configurable resistor network, wherein the configurable resistor network is configured to match one of: a low resistance state (LRS), a high resistance state (HRS) and a normal resistance state and the configurable resistor network is further configured to emulate a resistive element of the memory cell;
   a step current generator circuit connected to the configurable resistor network, wherein the step current generator is used to adjust the reference current level provided by the current reference circuit; and
   wherein the configurable resistor network, and the step current generator circuit are configured to track process, voltage and temperature (PVT) variations.

2. The current reference circuit of claim 1, further comprising:
a replica access path, wherein the replica access path is connected to a first terminal of the configurable resistor network and a replica selector circuit connected to a second terminal of the configurable resistor network.

3. The current reference circuit of claim 2, wherein the replica access path emulates an access path associated with the memory cell and the replica selector circuit emulates a selector circuit associated with the memory cell.

4. The current reference circuit of claim 2, wherein the replica access path includes one or more transistor devices that match the resistance of logic devices, metal wire resistance and leakage associated with the memory cell.

5. The current reference circuit of claim 2, wherein the configurable resistor network includes:
a first terminal of a first resistor device connected to the replica access path;
a second terminal of the first resistor connected to a first terminal of a second resistor device;
a second terminal of the second resistor device connected to a first terminal of a third resistor device;
a second terminal of the third resistor device connected to a first terminal of a step resistor device;
a second terminal of the step resistor device connected to the replica selector circuit.

6. The current reference circuit of claim 5, provides a high resistance (RH) that matches the high resistance state (HRS) verify level.

7. The current reference circuit of claim 5, wherein:
switching the first terminal of the third resistor device to connect directly to the replica access path provides a low resistance (RL) that matches the low resistance state (LRS) verify level;
switching the first terminal of the second resistor device to connect directly to the replica access path provides a middle resistance that matches the normal resistance state; and
adjusting the step resistor device provides additional adjustment to a resistance value provided by the configurable resistor network.

8. The current reference circuit of claim 2, wherein the configurable resistor network includes:
a first terminal of a first resistor device connected to the replica access path;
a second terminal of the first resistor device connected to a first terminal of a first switch device;
a first terminal of a second resistor device connected to the replica access path;
a second terminal of the second resistor device connected to a first terminal of a second switch device;
a first terminal of a third resistor network connected to the replica access path;
a second terminal of the third resistor device connected to a first terminal of a third switch device;
the second terminals of the first switch device, the second switch device and the third switch device connected to the first terminal of a step resistor device; and
a second terminal of the step resistor device connected to the replica selector circuit.

9. The current reference circuit of claim 8, wherein:
disabling the second switch device and the third switch device provides a high resistance (RH) that matches the high resistance state (HRS) verify level;
disabling the first switch device and the third switch device provides a middle resistance that matches the normal resistance state;
disabling the first switch device and the second switch device provides a low resistance (RL) that matches the low resistance state (LRS) verify level; and
adjusting the step resistor device provides additional adjustment to a resistance value provided by the configurable resistor network.

10. The current reference circuit of claim 2, wherein the replica selector circuit is an array of transistor devices wherein the array includes one of: four transistor devices or nine transistor devices.

11. The current reference circuit of claim 10, wherein the four transistor devices include two sets of two transistors, wherein the two transistors from each set of two transistors are connected in a parallel configuration and the two sets of two transistors are connected in a series configuration.

12. The current reference circuit of claim 3, wherein the replica selector circuit is a single NMOS transistor device that tracks the selector circuit associated with the memory cell.

13. The current reference circuit of claim 1, the step current generator circuit includes:
a current generator circuit;
a current mirror circuit connected to the current generator circuit; and
a first terminal of a switch device connected to the current mirror circuit and a second terminal of the switch device connected to the configurable resistor network, wherein:
upon enabling the switch device, a current generated by the current generator circuit and mirrored by the current mirror circuit is used to adjust the reference current level provided by the current reference circuit.

14. The current reference circuit of claim 1, wherein the low resistance state (LRS) is used to represent a logic value of 0 and the high resistance state (HRS) is used to represent a logic value of 1.

15. A system comprising:
a memory device wherein the memory device includes:
a memory cell;
a first terminal of an access path connected to a first terminal of the memory cell; and
a current reference circuit, wherein the current reference circuit includes:
a configurable resistor network, wherein the configurable resistor network is configured to match one of: a low resistance state (LRS), a high resistance state (HRS) and a normal resistance state, and the configurable resistor network is further configured to emulate a resistive element of the memory cell; and
a replica access path, wherein a first terminal of the replica access path is connected to a first terminal of the configurable resistor network and wherein the replica access path emulates the access path associated with the memory cell; and
a sense amplifier circuit including two input terminals, wherein a second terminal of the access path is connected to one input terminal of the sense amplifier circuit and a second terminal of the replica access path is connected to another input terminal of the sense amplifier circuit.

16. The system of claim 15 further comprising:
a selector circuit connected to a second terminal of the memory cell; and
the current reference circuit further comprising:
a replica selector circuit connected to a second terminal of the configurable resistor network and wherein the replica selector circuit emulates the selector circuit associated with the memory cell.

17. The current reference circuit from the system of claim 15 further comprising:
a step current generator circuit connected to the configurable resistor network, wherein the step current generator is used to adjust a reference current level provided by the current reference circuit.

18. The system of claim 15, wherein the sense amplifier senses the variations in current between the memory device and the reference current level provided by the current reference circuit to determine a data value stored in the memory cell.

19. The system of claim 16, wherein the configurable resistor network includes:
a first terminal of a first resistor device connected to the replica access path;
a second terminal of the first resistor device connected to a first terminal of a first switch device;
a first terminal of a second resistor device connected to the replica access path;
a second terminal of the second resistor device connected to a first terminal of a second switch device;
a first terminal of a third resistor network connected to the replica access path;
a second terminal of the third resistor device connected to a first terminal of a third switch device;
the second terminals of the first switch device, the second switch device and the third switch device connected to the first terminal of a step resistor device; and
a second terminal of the step resistor device connected to the replica selector circuit.

20. A system comprising:
a memory device wherein the memory device includes a memory cell;
a current reference circuit, wherein the current reference circuit includes:
a configurable resistor network, wherein the configurable resistor network is configured to match one of: a low resistance state (LRS), a high resistance state (HRS) and a normal resistance state, and the configurable resistor network is further configured to emulate a resistive element of the memory cell; and
a sense amplifier circuit including two input terminals, wherein the memory device is connected to one input terminal of the sense amplifier circuit and the current reference circuit is connected to another input terminal of the sense amplifier circuit and the sense amplifier circuit senses the variations in current between the memory device and the reference current level provided by the current reference circuit to determine a data value stored in the memory cell.

\* \* \* \* \*